(12) United States Patent
Sugiyama et al.

(10) Patent No.: US 8,492,469 B2
(45) Date of Patent: Jul. 23, 2013

(54) POSITIVE-TYPE PHOTOSENSITIVE RESIN COMPOSITION, CURED FILM, PROTECTIVE FILM, INSULATING FILM, AND SEMICONDUCTOR DEVICE AND DISPLAY DEVICE INCLUDING THE CURED FILM

(75) Inventors: Hiromichi Sugiyama, Tokyo (JP); Yasunori Takahashi, Tokyo (JP)

(73) Assignee: Sumitomo Bakelite Co., Ltd., Tokyo (JP)

( * ) Notice: Subject to any disclaimer, the term of this patent is extended or adjusted under 35 U.S.C. 154(b) by 212 days.

(21) Appl. No.: 12/991,125

(22) PCT Filed: Apr. 28, 2009

(86) PCT No.: PCT/JP2009/058728
§ 371 (c)(1),
(2), (4) Date: Jan. 12, 2011

(87) PCT Pub. No.: WO2009/136647
PCT Pub. Date: Nov. 12, 2009

(65) Prior Publication Data
US 2011/0136952 A1 Jun. 9, 2011

(30) Foreign Application Priority Data
May 7, 2008 (JP) ................... 2008-120846

(51) Int. Cl.
*C08K 13/02* (2006.01)
(52) U.S. Cl.
USPC ........................................................ 524/265
(58) Field of Classification Search
USPC ........................................................ 524/265
See application file for complete search history.

(56) References Cited

FOREIGN PATENT DOCUMENTS

| | | |
|---|---|---|
| CN | 1165980 | 11/1997 |
| EP | 0807852 | 11/1997 |
| JP | 01-046862 B2 | 3/1981 |
| JP | 10-010740 | 1/1998 |
| JP | 10-217421 | 8/1998 |
| JP | 11-258787 | 9/1999 |
| JP | 2000-347401 | 12/2000 |
| JP | 2003-531942 | 10/2003 |
| JP | 2005-242344 | 9/2005 |
| JP | 2007-078812 | 3/2007 |
| JP | 2008-058839 | 3/2008 |
| WO | WO 2007/004345 | 1/2007 |

OTHER PUBLICATIONS

JP 2005 242344 machine translation (2005).*
Database WPI Week 200736, Thomson Scientific, London, GB; AN 2007-382596, XP002663485.
Supplementary European Search Report for corresponding EP Application No. 09742771.0-2222, Nov. 30, 2011.
Chinese Office Action for corresponding CN Application No. 200980116236.9, Jan. 18, 2012.
International Search Report for International Application No. PCT/JP2009/058728, Jul. 21, 2009.
Written Opinion of the International Searching Authority for International Application No. PCT/JP2009/058728, Jul. 21, 2009.
Japanese Office Action for corresponding JP Application No. 2010-511091, Jan. 8, 2013.

* cited by examiner

*Primary Examiner* — Kuo-Liang Peng
(74) *Attorney, Agent, or Firm* — Ditthavong Mori & Steiner, P.C.

(57) ABSTRACT

A positive-type photosensitive resin composition includes (A) an alkali-soluble resin, (B) a photosensitizer, and (C) a silicon compound shown by the following general formula (1).

$$(R_2O)_3-Si-R_1-Si-(OR_2)_3 \qquad (1)$$

wherein $R_1$ represents an alkylene group having 5 to 30 carbon atoms or an organic group that includes at least one aromatic ring, and $R_2$ represents an alkyl group having 1 to 10 carbon atoms. The positive-type photosensitive resin composition exhibits excellent storage stability, produces a film that exhibits excellent adhesion to a substrate during development, and produces a cured film that exhibits excellent adhesion to a substrate after humidification.

10 Claims, No Drawings

POSITIVE-TYPE PHOTOSENSITIVE RESIN COMPOSITION, CURED FILM, PROTECTIVE FILM, INSULATING FILM, AND SEMICONDUCTOR DEVICE AND DISPLAY DEVICE INCLUDING THE CURED FILM

TECHNICAL FIELD

The present invention relates to a positive-type photosensitive resin composition, a cured film, a protective film, an insulating film, and a semiconductor device and a display device including the cured film.

BACKGROUND ART

A polyimide resin that exhibits excellent heat resistance, electrical properties, mechanical properties, and the like has been used as a surface protective film, an interlayer dielectric, and the like for semiconductor devices. In recent years, a polybenzoxazole resin that exhibits excellent moisture resistance due to the absence of a carbonyl group derived from a polar imide ring, has been used. By adding the photosensitivity to rein, the photosensitive resin composition that can reduce the patterning process has been developed.

A positive-type photosensitive resin composition developable with an alkaline aqueous solution, that includes a polybenzoxazole precursor and a diazoquinone compound (photosensitizer), has been developed in order to improve safety (see Patent Document 1).

A relief pattern is formed as follows using a positive-type photosensitive resin composition. Note that the following focuses on the development mechanism. Actinic rays are applied to a film formed on a wafer through a mask using a stepper so that an exposed area and an unexposed area are obtained. The diazoquinone compound included in the unexposed area is insoluble in an alkaline aqueous solution, and is provided with resistance to an alkaline aqueous solution as a result of interaction with a resin. The diazoquinone compound included in the exposed area chemically changes due to the actinic rays, and becomes soluble in an alkaline aqueous solution, so that dissolution of the resin is promoted. A relief pattern can be formed by dissolving (removing) the exposed area by utilizing a difference in solubility between the exposed area and the unexposed area.

In recent years, high-performance semiconductor devices have been rapidly developed, and a semiconductor device that implements an increase in speed and a reduction in size, cost, and power consumption has been desired. Therefore, it is necessary to reduce the size of the semiconductor element of the semiconductor device, and the relief pattern of the element has been reduced in size. As a result, the contact area of a film and a substrate has decreased. When using the photosensitive resin composition disclosed in Patent Document 1, a fine relief pattern may be removed from a substrate during development, or a cured film may be removed after humidification. (Patent Document 1) JP-B-1-46862

DISCLOSURE OF THE INVENTION

The present invention was conceived in view of the above situation. An object of the present invention is to provide a positive-type photosensitive resin composition that exhibits excellent storage stability, produces a film that exhibits excellent adhesion to a substrate during development, and produces a cured film that exhibits excellent adhesion to a substrate after humidification. Another object of the present invention is to provide a cured film, a protective film, and an insulating film that exhibit excellent adhesion to a substrate after humidification, and a semiconductor device and a display device including the cured film.

The above objects are achieved by the following (see [1] to [12]).

[1] A positive-type photosensitive resin composition including (A) an alkali-soluble resin, (B) a photosensitizer, and (C) a silicon compound shown by the following general formula (1),

wherein $R_1$ represents an alkylene group having 5 to 30 carbon atoms or an organic group that includes at least one aromatic ring, and $R_2$ represents an alkyl group having 1 to 10 carbon atoms.

[2] The positive-type photosensitive resin composition according to [1], wherein the alkali-soluble resin (A) includes a polyamide resin that includes a repeating unit shown by the following general formula (2),

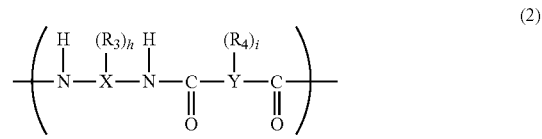

wherein X and Y represent an organic group, $R_3$ individually represents a hydroxyl group, —O—$R_5$, an alkyl group, an acyloxy group, or a cycloalkyl group ($R_3$ may be the same or different), $R_4$ individually represents a hydroxyl group, a carboxyl group, —O—$R_5$, or —COO—$R_5$ ($R_4$ may be the same or different), h is an integer from 0 to 8, i is an integer from 0 to 8, and $R_5$ represents an organic group having 1 to 15 carbon atoms, provided that $R_3$ may be the same or different when h is an integer equal to or larger than 2, at least one $R_4$ represents a carboxyl group when $R_3$ does not represent a hydroxyl group, and at least one $R_3$ represents a hydroxyl group when $R_4$ does not represent a carboxyl group.

[3] The positive-type photosensitive resin composition according to [1] or [2], wherein X in the general formula (2) is at least one of structures shown by the following formula (3),

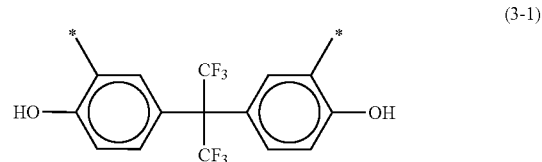

(3-1)

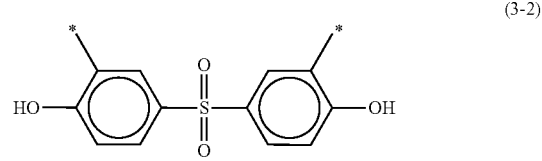

(3-2)

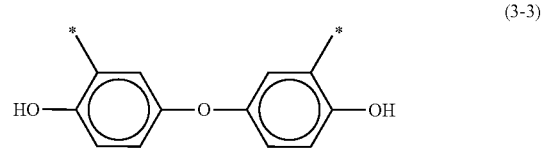

(3-3)

(3-4)

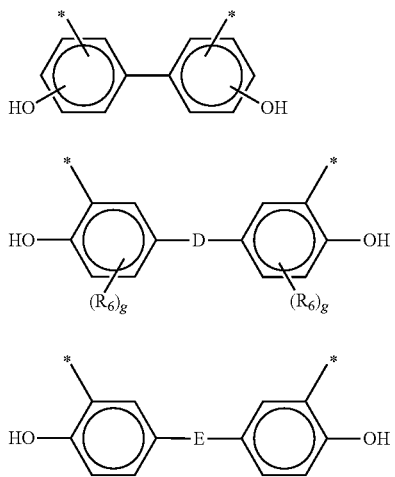

(3-5)

(3-6)

wherein the asterisk (*) represents the NH group, D represents —$CH_2$—, —$CH(CH_3)$—, —$C(CH_3)_2$—, —O—, —S—, —$SO_2$—, —CO—, —NHCO—, —$C(CF_3)_2$—, or a single bond, E represents —$CH_2$—, —$CH(CH_3)$—, or —$C(CH_3)_2$—, $R_6$ individually represent an alkyl group, an alkoxy group, an acyloxy group, or a cycloalkyl group, and g is an integer from 1 to 3.

[4] The positive-type photosensitive resin composition according to any one of [1] to [3], wherein $R_1$ in the general formula (1) represents an alkylene group having 6 to 8 carbon atoms.

[5] The positive-type photosensitive resin composition according to any one of [1] to [4], wherein —$R_1$— in the general formula (1) represents a structure shown by the following general formula (4),

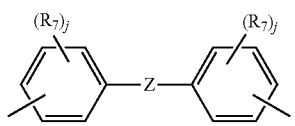

(4)

wherein $R_7$ individually represent an alkyl group, an alkoxy group, an acyloxy group, or a cycloalkyl group, j is an integer from 0 to 4, and Z represents a single bond, —$CH_2$—, —CH($CH_3$)—, or —$C(CH_3)_2$—.

[6] The positive-type photosensitive resin composition according to any one of [1] to [5], wherein —$R_1$— in the general formula (1) represents at least one of structures shown by the following general formula (5).

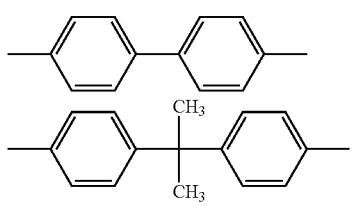

(5)

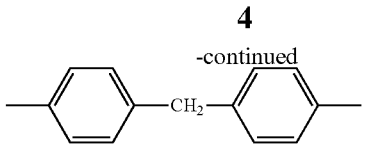

[7] The positive-type photosensitive resin composition according to any one of [1] to [6], wherein the content of the silicon compound (C) is 0.1 to 30 parts by weight based on 100 parts by weight of the alkali-soluble resin (A).

[8] A cured film including a cured product of the positive-tone photosensitive resin composition according to any one of [1] to [7].

[9] A protective film including the cured film according to [8].

[10] An insulating film including the cured film according to [8].

[11] A semiconductor device including the cured film according to [8].

[12] A display device including the cured film according to [8].

The present invention can provide a positive-type photosensitive resin composition that exhibits excellent storage stability, produces a film that exhibits excellent adhesion to a substrate during development, and produces a cured film that exhibits excellent adhesion to a substrate after humidification. The present invention can also provide a cured film, a protective film, and an insulating film that exhibit excellent adhesion to a substrate after humidification, and a semiconductor device and a display device including the cured film.

BEST MODE FOR CARRYING OUT THE INVENTION

Embodiments of the positive-tone photosensitive resin composition, the cured film, the protective film, the insulating film, the semiconductor device, and the display device according to the present invention are described in detail below.

A positive-type photosensitive resin composition according to one embodiment of the present invention includes (A) an alkali-soluble resin, (B) a photosensitizer, and (C) a silicon compound shown by the following general formula (1).

$$(R_2O)_3—Si—R_1Si—(OR_2)_3 \quad (1)$$

wherein $R_1$ represents an alkylene group having 5 to 30 carbon atoms or an organic group having at least one aromatic ring, and $R_2$ represents an alkyl group having 1 to 10 carbon atoms.

It is preferable that $R_1$ in the general formula (1) represent an alkylene group having 6 to 8 carbon atoms.

It is preferable that —$R_1$— in the general formula (1) represent at least one of structures shown by the following general formula (5).

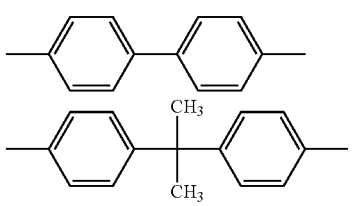

(5)

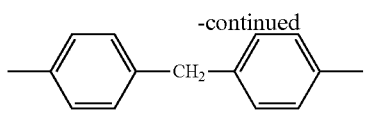

A cured film according to one embodiment of the present invention includes a cured product of the above positive-type photosensitive resin composition. A protective film and an insulating film according to one embodiment of the present invention includes the above cured film. A semiconductor device and a display device according to one embodiment of the present invention includes the above cured film.

Each component of the positive-type photosensitive resin composition is described in detail below. Note that the present invention is not limited to the following exemplary disclosure.

(1) Positive-Type Photosensitive Resin Composition

Examples of the alkali-soluble resin (A) include, but are not limited to, a cresol novolac resin, a hydroxystyrene resin, an acrylic resin (e.g., methacrylic acid resin and methacrylate resin), a cycloolefin resin that includes a hydroxyl group, a carboxyl group, or the like, a polyamide resin, and the like. Among these, it is preferable to use the polyamide resin due to excellent heat resistance and mechanical properties. Specific examples of the polyamide resin include a resin that includes at least one of a polybenzoxazole structure and a polyimide structure, and includes a hydroxyl group, a carboxyl group, an ether group, or an ester group in the main chain or side chain, a resin that includes a polybenzoxazole precursor structure, a resin that includes a polyimide precursor structure, a resin that includes a polyamide acid ester structure, and the like. Further examples of the polyamide resin include a polyamide resin that includes a repeating unit shown by the following general formula (2).

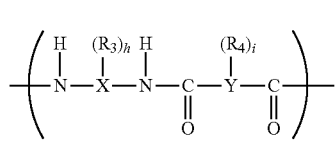

wherein X and Y represent an organic group, $R_3$ represents a hydroxyl group, —O—$R_5$, an alkyl group, an acyloxy group, or a cycloalkyl group ($R_3$ may be the same or different), $R_4$ individually represents a hydroxyl group, a carboxyl group, —O—$R_5$, or —COO—$R_5$ ($R_4$ may be the same or different), h is an integer from 0 to 8, i is an integer from 0 to 8, and $R_5$ represents an organic group having 1 to 15 carbon atoms, provided that $R_3$ may be the same or different when h is an integer equal to or larger than 2, at least one $R_4$ represents a carboxyl group when $R_3$ does not represent a hydroxyl group, and at least one $R_3$ represents a hydroxyl group when $R_4$ does not represent a carboxyl group.

In the polyamide resin shown by the general formula (2), —O—$R_5$ that substitutes X and —O—$R_5$ or —COO—$R_5$ that substitutes Y are groups obtained by protecting a hydroxyl group or a carboxyl group with $R_5$ (i.e., an organic group having 1 to 15 carbon atoms) in order to adjust the solubility of the hydroxyl group or the carboxyl group in an alkaline aqueous solution. The hydroxyl group or the carboxyl group may be protected with $R_5$, if necessary. Examples of the organic group represented by $R_5$ include a formyl group, a methyl group, an ethyl group, a propyl group, an isopropyl group, a tert-butyl group, a tert-butoxycarbonyl group, a phenyl group, a benzyl group, a tetrahydrofuranyl group, a tetrahydropyranyl group, and the like.

The polyamide resin that includes the repeating unit shown by the general formula (2) is obtained by reacting a diamine, a bis(aminophenol), a 2,4-diaminophenol, or the like that includes X (or X bonded to $R_3$) with a tetracarboxylic dianhydride, a trimellitic anhydride, a dicarboxylic acid, a dicarboxylic acid dichloride, a dicarboxylic acid derivative, a hydroxydicarboxylic acid, a hydroxydicarboxylic acid derivative, or the like that includes Y (or Y bonded to $R_4$), for example. An active ester-type dicarboxylic acid derivative that has been reacted with 1-hydroxy-1,2,3-benzotriazole or the like may be used to increase the reaction yield and the like.

Examples of the structure represented by X in the general formula (2) include an aromatic ring (e.g., benzene ring and naphthalene ring), a bisphenol skeleton, a heterocyclic skeleton (e.g., pyrrole skeleton and furan skeleton), a siloxane skeleton, and the like. Specific examples of the structure represented by X include structures shown by the following formula (6). The repeating unit shown by the general formula (2) includes at least one structure as X.

(6-1)

(6-2)

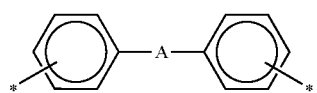

(6-3)

(6-4)

(6-5)

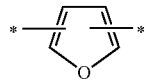

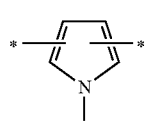

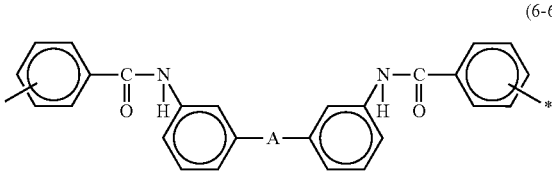

(6-6)

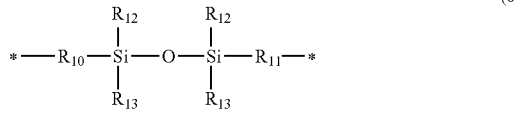

(6-7)

wherein the asterisk (*) represents the NH group, A represents —$CH_2$—, —$CH(CH_3)$—, —$C(CH_3)_2$—, —O—, —S—, —$SO_2$—, —CO—, —NHCO—, —$C(CF_3)_2$—, or a single bond, $R_8$ individually represents an alkyl group, an alkyl ester group, an alkyl ether group, a benzyl ether group, or a halogen atom, provided that $R_8$ may be the same or different when k is an integer equal to or larger than 2, $R_9$ represents a hydrogen atom, an alkyl group, an alkyl ester group, or a halogen atom, k is an integer from 0 to 4, and $R_{10}$, $R_{11}$, $R_{12}$, and $R_{13}$ represent an organic group.

In the general formula (2), the number of $R_3$ bonded to X is 0 to 8 ($R_3$ is omitted in the formula (6)).

Among the structures shown by the formula (6), structures shown by the following formula (7) are preferable since excellent heat resistance and mechanical properties are obtained.

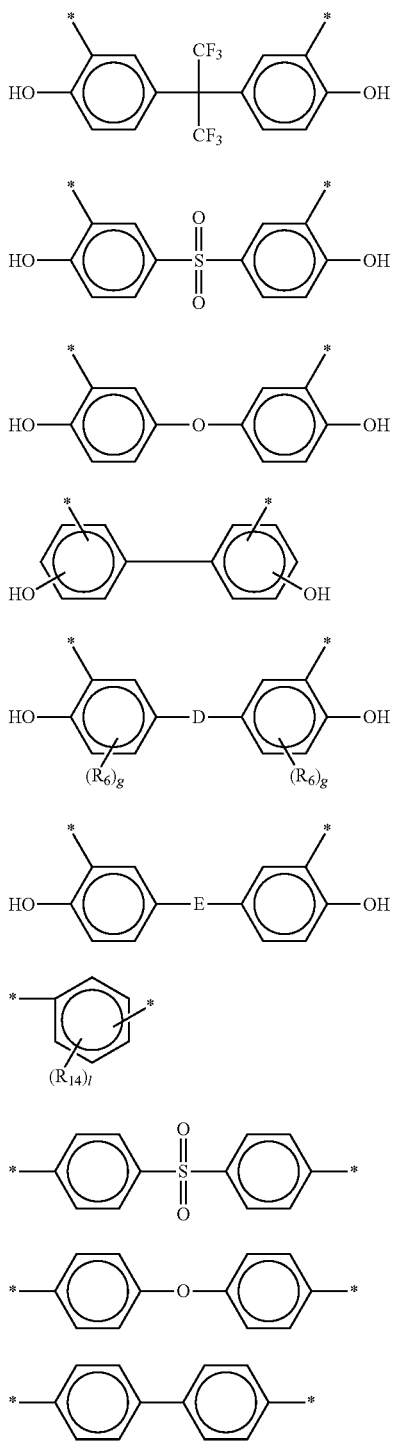

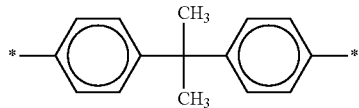

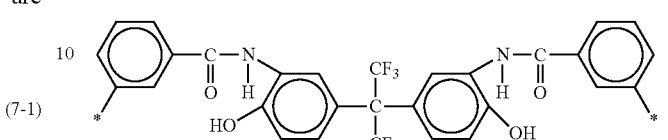

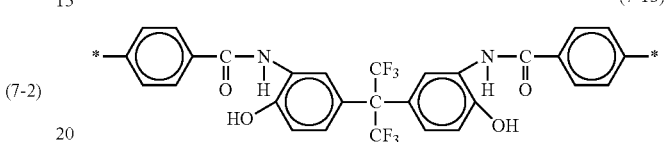

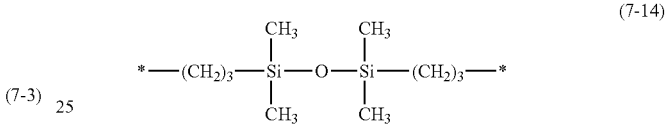

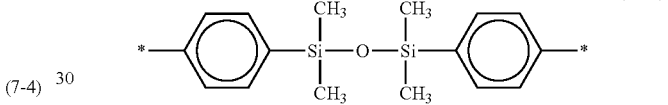

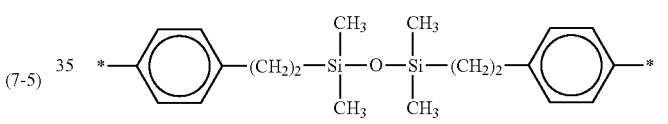

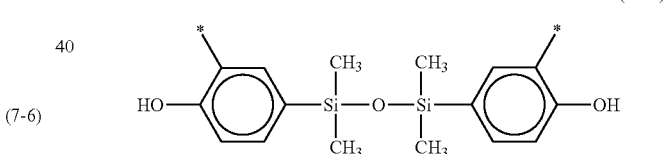

wherein the asterisk (*) represents the NH group, D represents —$CH_2$—, —$CH(CH_3)$—, —$C(CH_3)_2$—, —O—, —S—, —$SO_2$—, —CO—, —NHCO—, —$C(CF_3)_2$—, or a single bond, E represents —$CH_2$—, —$CH(CH_3)$—, or —$C(CH_3)_2$—, $R_6$ individually represent an alkyl group, an alkoxy group, an acyloxy group, or a cycloalkyl group ($R_6$ may be the same or different), $R_{14}$ individually represents an alkyl group, an alkyl ester group, or a halogen atom, g is an integer from 1 to 3, and l is an integer from 0 to 4 ($R_{14}$ may be the same or different).

Among the structures shown by the formula (7), structures shown by the following formula (3) are particularly preferable. When X (or X bonded to $R_3$) in the polyamide resin that includes the repeating unit shown by the general formula (2) is one of the structures shown by the formula (3), the resulting cured film exhibits improved adhesion to a substrate after humidification by utilizing the polyamide resin in combination with the silicon compound (C) shown by the general formula (1).

(3-1)
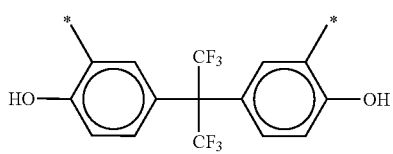

(3-2)
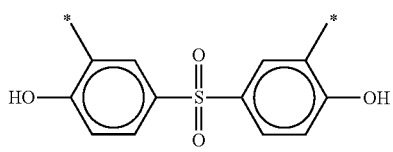

(3-3)
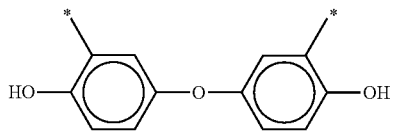

(3-4)
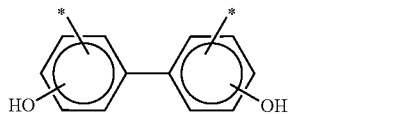

(3-5)
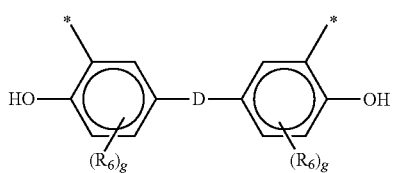

(3-6)
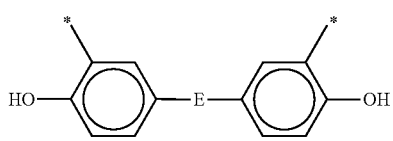

wherein the asterisk (*) represents the NH group, D represents —$CH_2$—, —$CH(CH_3)$—, —$C(CH_3)_2$—, —O—, —S—, —$SO_2$—, —CO—, —NHCO—, —$C(CF_3)_2$—, or a single bond, E represents —$CH_2$—, —$CH(CH_3)$—, or —$C(CH_3)_2$—, $R_6$ individually represent an alkyl group, an alkoxy group, an acyloxy group, or a cycloalkyl group, and g is an integer from 1 to 3.

Y in the polyamide resin that includes the repeating unit shown by the general formula (2) represents an organic group. Examples of the organic group represented by Y include the organic groups mentioned above in connection with X. Specific examples of the organic group represented by Y include an aromatic ring (e.g., benzene ring and naphthalene ring), a bisphenol skeleton, a heterocyclic skeleton (e.g., pyrrole skeleton and furan skeleton), a siloxane skeleton, and the like. Note that structures shown by the following formula (8) are preferable. The repeating unit shown by the general formula (2) includes at least one structure as Y.

(8-1)
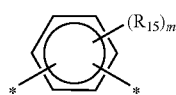

(8-2)
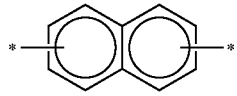

(8-3)
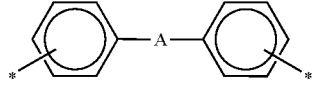

(8-4)
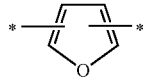

(8-5)
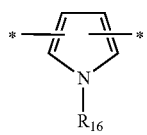

(8-6)
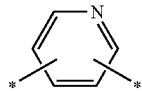

(8-7)
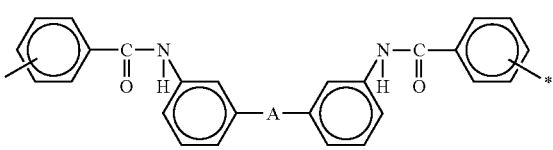

(8-8)
$$*-R_{17}-\underset{\underset{R_{19}}{|}}{\overset{\overset{R_{18}}{|}}{Si}}-O-\underset{\underset{R_{19}}{|}}{\overset{\overset{R_{18}}{|}}{Si}}-R_{17}-*$$

wherein the asterisk (*) represents the C=O group, $R_{15}$ individually represents an alkyl group, an alkyl ester group, an alkyl ether group, a benzyl ether group, or a halogen atom, provided that $R_{15}$ may be the same or different when m is an integer equal to or larger than 2, $R_{16}$ represents a hydrogen atom, an alkyl group, an alkyl ester group, or a halogen atom, A represents —$CH_2$—, —$CH(CH_3)$—, —$C(CH_3)_2$—, —O—, —S—, —$SO_2$—, —CO—, —NHCO—, —$C(CF_3)_2$—, or a single bond, m is an integer from 0 to 4, and $R_{17}$, $R_{18}$, and $R_{19}$ represent an organic group.

In the general formula (2), the number of $R_4$ bonded to Y is 0 to 8 ($R_4$ is omitted in the formula (8)).

Among the structures shown by the formula (8), structures shown by the following formulas (9) and (10) are preferable since excellent heat resistance and mechanical properties are obtained.

In the structure derived from the tetracarboxylic dianhydride shown by the formula (9), the both C=O groups are bonded at the meta-position or the both C=O groups are bonded at the para-position. Note that the C=O groups may be bonded at the meta-position and the para-position.

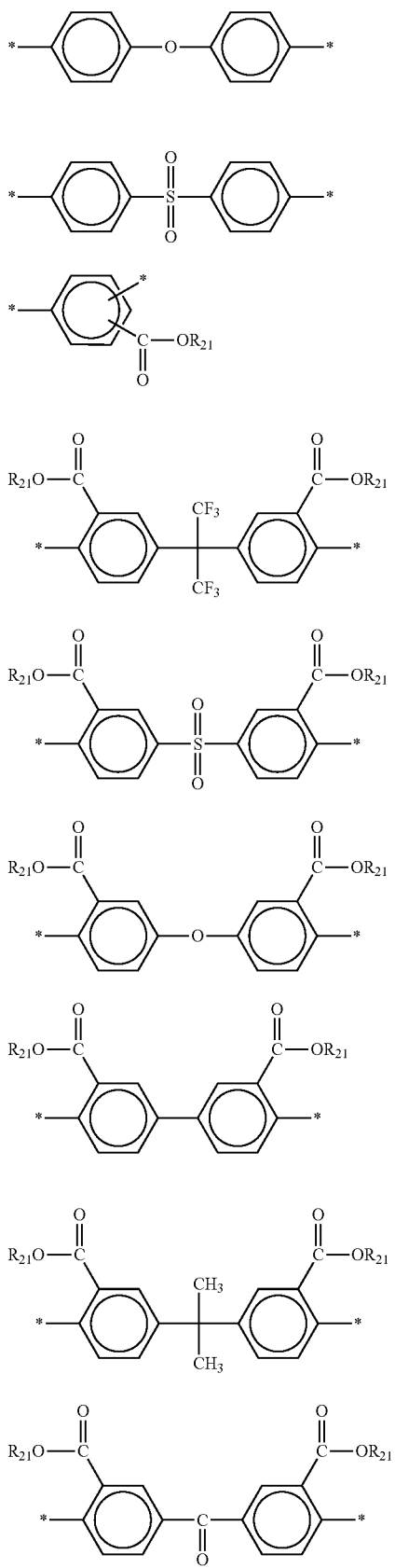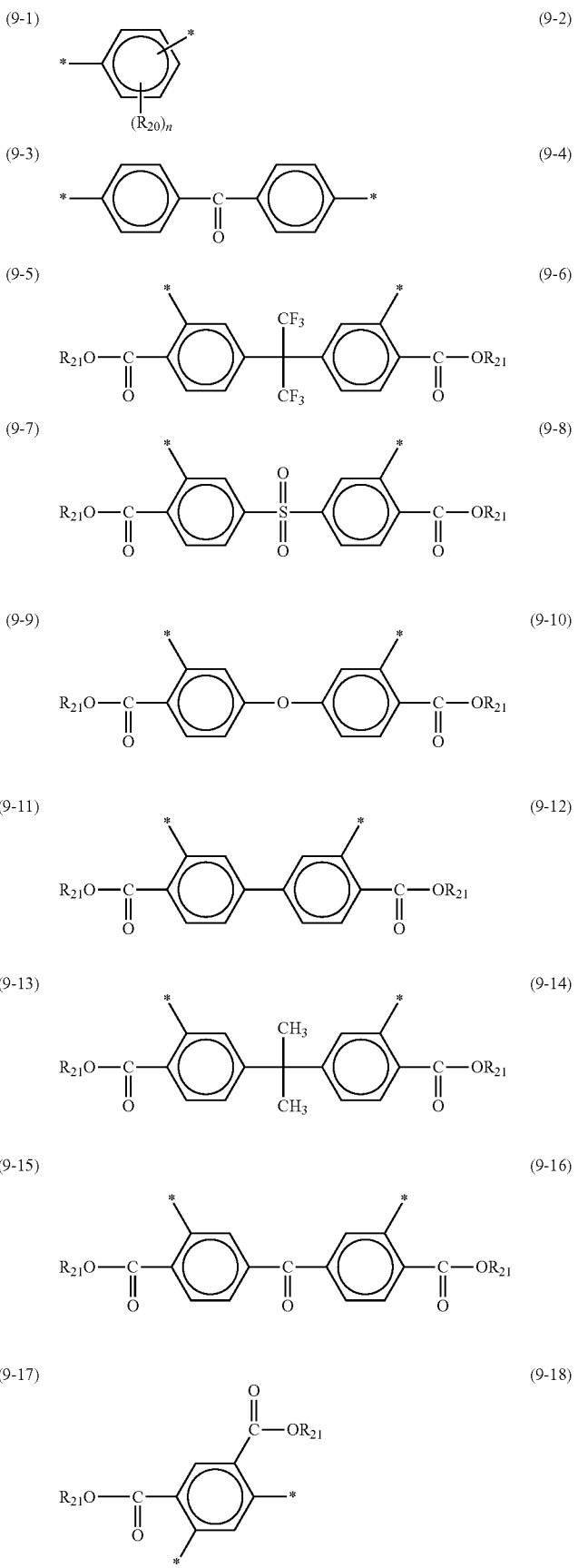

(9-19)
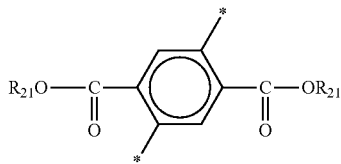

(9-20)
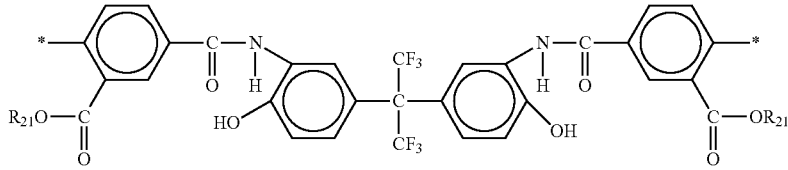

(9-21)
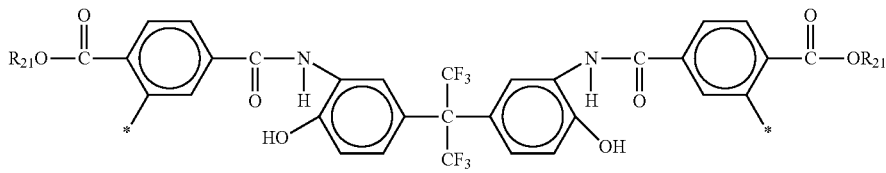

wherein the asterisk (*) represents the C=O group, $R_{20}$ individually represents an alkyl group, an alkyl ester group, an alkyl ether group, a benzyl ether group or a halogen atom, $R_{21}$ represents a hydrogen atom or an organic group having 1 to 15 carbon atoms, and n is an integer from 0 to 4.

(10-1)
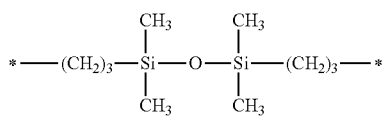

(10-2)
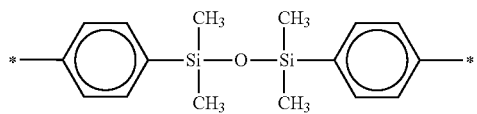

(10-3)
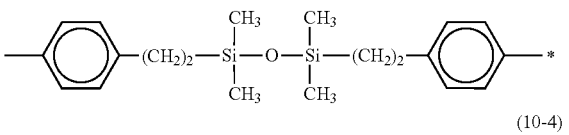

(10-4)
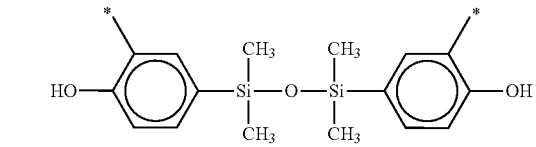

wherein the asterisk (*) represents the C=O group.

Among the structures shown by the formulas (9) and (10), structures shown by the following formula (11) are particularly preferable. When Y (or Y bonded to $R_4$) in the polyamide resin that includes the repeating unit shown by the general formula (2) is one of the structures shown by the formula (11), the resulting cured film exhibits improved adhesion to a substrate after humidification by utilizing the polyamide resin in combination with the silicon compound (C) shown by the general formula (1).

(11-1)
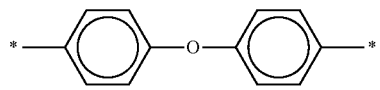

(11-2)
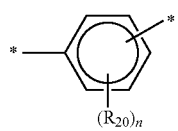

(11-3)
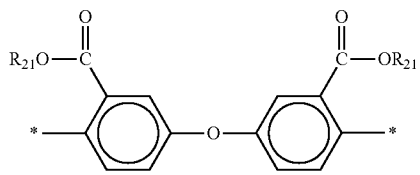

(11-4)
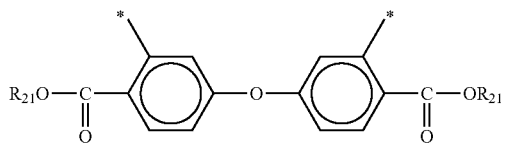

wherein the asterisk (*) represents the C=O group, $R_{20}$ individually represents an alkyl group, an alkyl ester group, an alkyl ether group, a benzyl ether group or a halogen atom ($R_{20}$ may be the same or different), $R_{21}$ represents a hydrogen atom or an organic group having 1 to 15 carbon atoms, and n is an integer from 0 to 4.

The polyamide resin that includes the repeating unit shown by the general formula (2) is a polymer that includes a main chain formed by the repeating units shown by the general formula (2).

The repeating units shown by the general formula (2) included in the polyamide resin that includes the repeating unit shown by the general formula (2) may be either the same or different within the scope of the structure shown by the general formula (2). Specifically, the main chain of the polyamide resin that includes the repeating unit shown by the general formula (2) may be formed by the same repeating units shown by the general formula (2) (i.e., repeating units that are identical as to X, $R_3$, h, Y, $R_4$, and i), or may be formed by different repeating units shown by the general formula (2) (i.e., repeating units that differ in at least one of X, $R_3$, h, Y, $R_4$, and i). The positive-type photosensitive resin composition includes at least one polyamide resin that includes the repeating unit shown by the general formula (2).

It is preferable that the polyamide resin that includes the repeating unit shown by the general formula (2) have a structure in which the main chain formed by the repeating units shown by the general formula (2) includes an amino group at its end, and the amino group is capped in the form of an amide using an acid anhydride including an aliphatic group or a cyclic compound group that includes at least one alkenyl group or alkynyl group. This improves storage stability.

Examples of a group derived from an acid anhydride including an aliphatic group or a cyclic compound group that includes at least one alkenyl group or alkynyl group via a reaction with an amino group include groups shown by the following formulas (12) and (13), and the like. These groups may be used either individually or in combination.

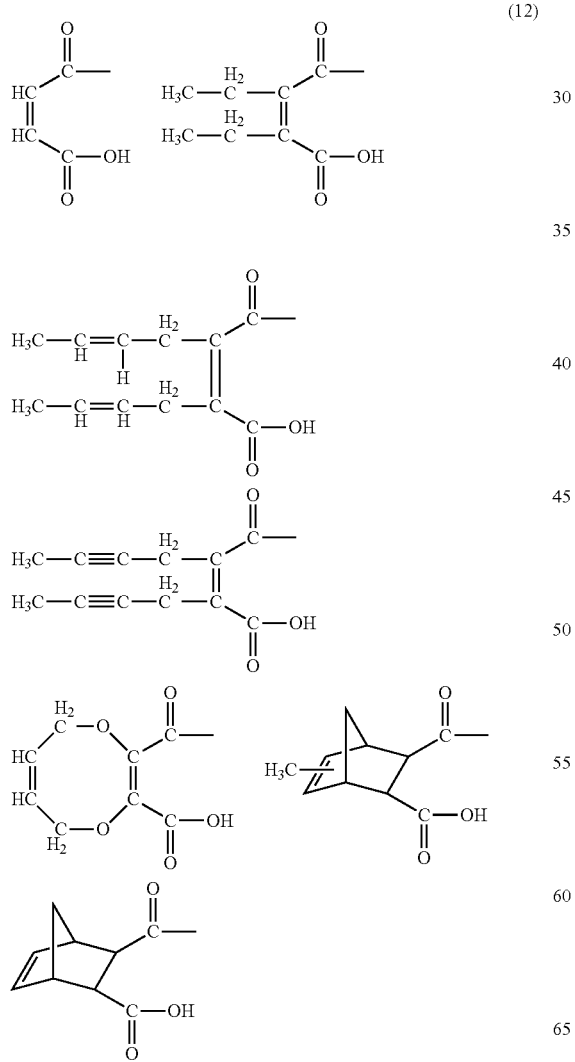

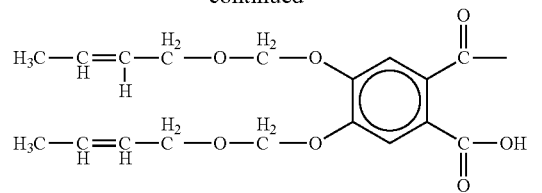

(13)

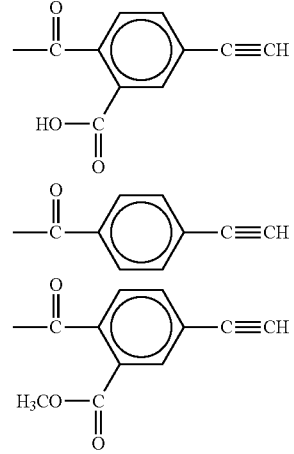

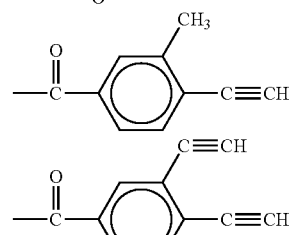

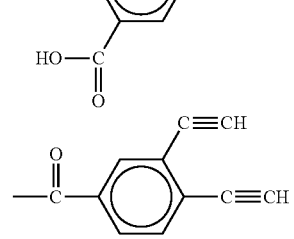

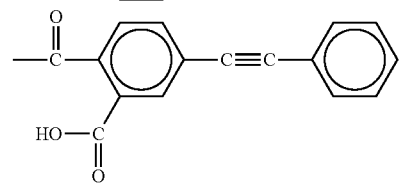

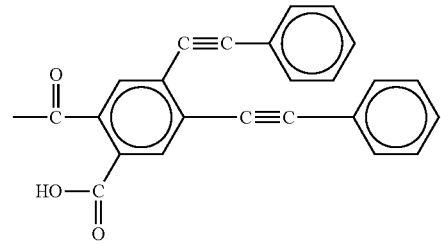

Among the groups shown by the formulas (12) and (13), groups shown by the following formula (14) are particularly preferable. When the group derived from an acid anhydride including an aliphatic group or a cyclic compound group that includes at least one alkenyl group or alkynyl group via a reaction with an amino group is one of the groups shown by the formula (14), storage stability is improved specially.

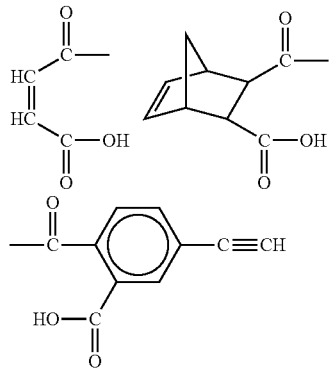
(14)

Note that an acid at the end of the polyamide resin that includes the repeating unit shown by the general formula (2) may be capped in the form of an amide using an amine derivative including an aliphatic group or a cyclic compound group that includes at least one alkenyl group or alkynyl group.

The polyamide resin that includes the repeating unit shown by the general formula (2) may include a group having a nitrogen-containing cyclic structure in at least one of its main chain and side chain. This improves adhesion to a metal wire (particularly copper wire) or the like. Specifically, when the polyamide resin includes an organic group including an unsaturated group at one end, the resulting cured film exhibits excellent mechanical properties (e.g., tensile elongation) due to a reaction of the resin. When the polyamide resin includes a group having a nitrogen-containing cyclic structure in at least one of its main chain and side chain, the nitrogen-containing cyclic compound reacts with a metal wire (e.g., copper wire or copper alloy wire) so that adhesion to the metal wire is improved.

Examples of the group having a nitrogen-containing cyclic structure include 1-(5-1H-triazoyl)methylamino group, 3-(1H-pyrazoyl)amino group, 4-(1H-pyrazoyl)amino group, 5-(1H-pyrazoyl)amino group, 1-(3-1H-pyrazoyl)methylamino group, 1-(4-1H-pyrazoyl)methylamino group, 1-(5-1H-pyrazoyl)methylamino group, (1H-tetrazol-5-yl)amino group, 1-(1H-tetrazol-5-yl)methylamino group, 3-(1H-tetrazol-5-yl)benzamino group, and the like. Among these, groups shown by the following formula (15) are preferable. When the group having a nitrogen-containing cyclic structure is one of the groups shown by the formula (15), adhesion to a metal wire (e.g., copper wire or copper alloy wire) is improved.

(15)

Examples of the photosensitizer (B) include an ester of a phenol compound and 1,2-naphthoquinone-2-diazido-5-sulfonic acid or 1,2-naphthoquinone-2-diazido-4-sulfonic acid.

Specific examples of the photosensitizer (B) include ester compounds shown by the following formulas (16) to (19). The photosensitizer (B) includes at least one of these compounds.

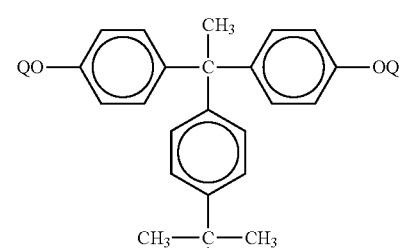
(16)

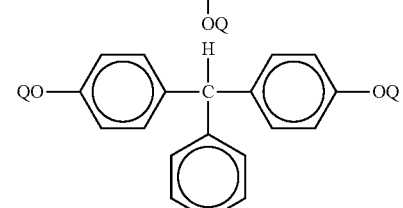

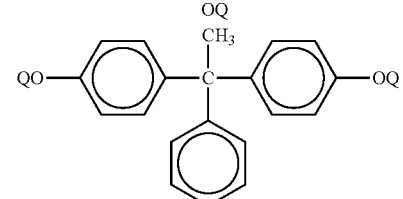

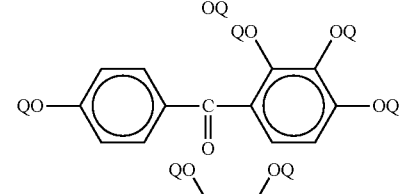

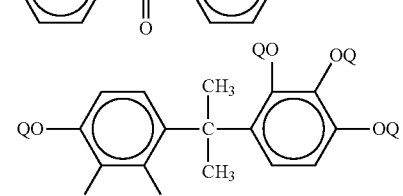

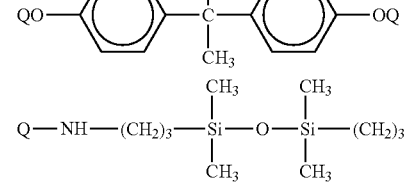

-continued
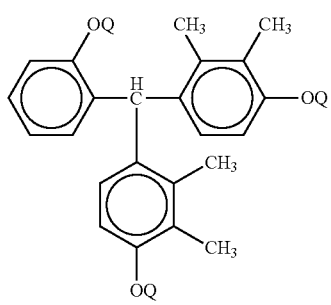
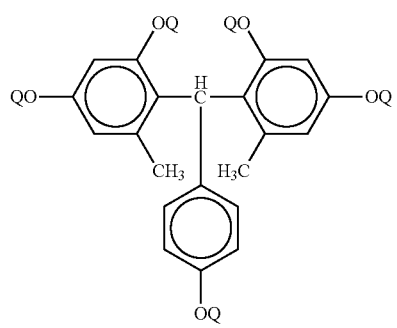
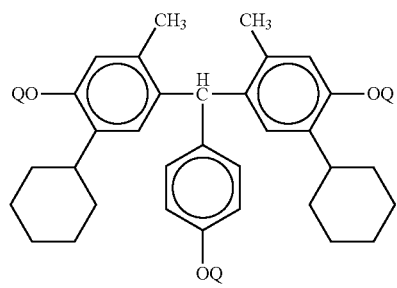
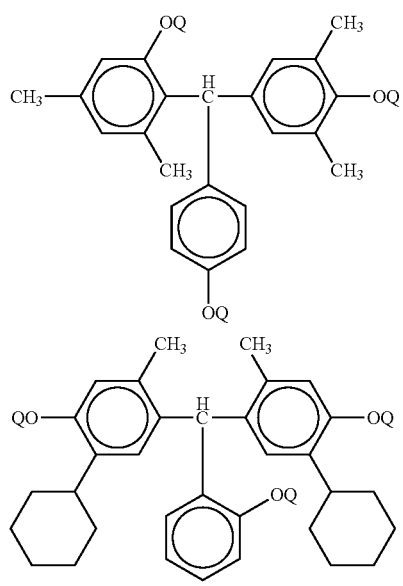
-continued
(17)
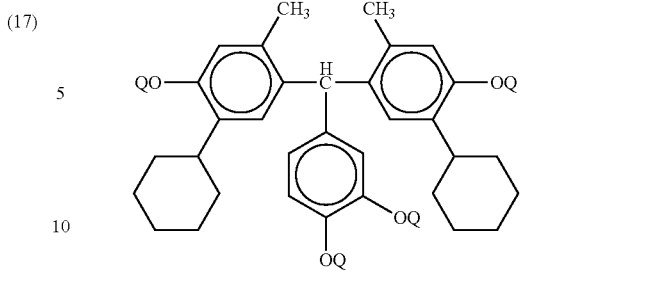
(18)
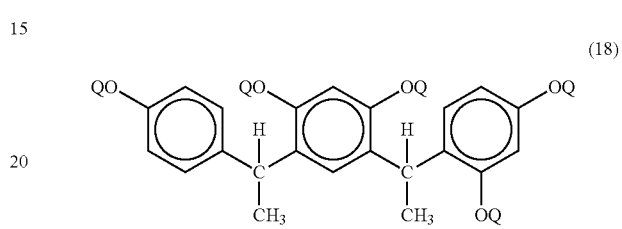
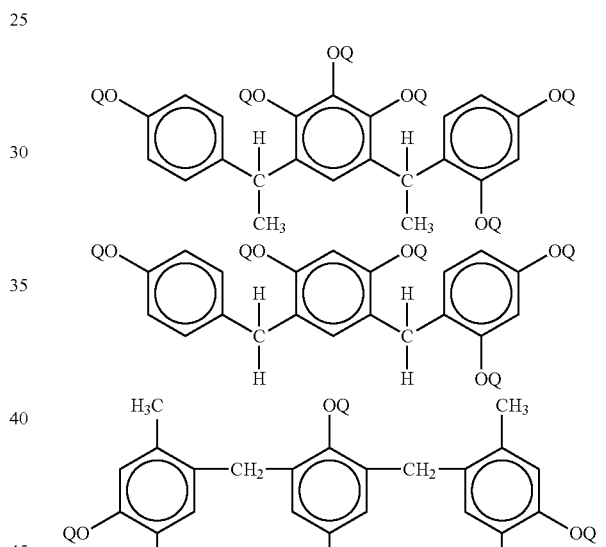
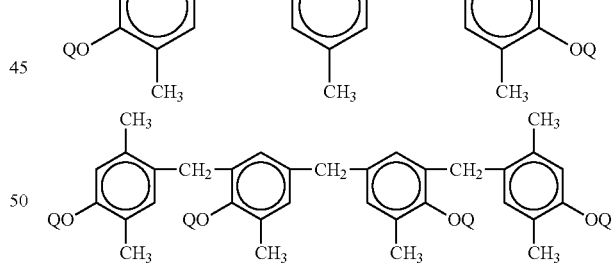
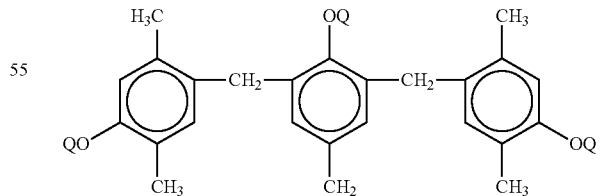
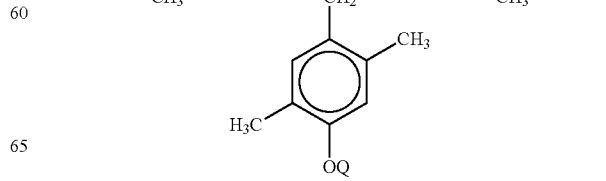

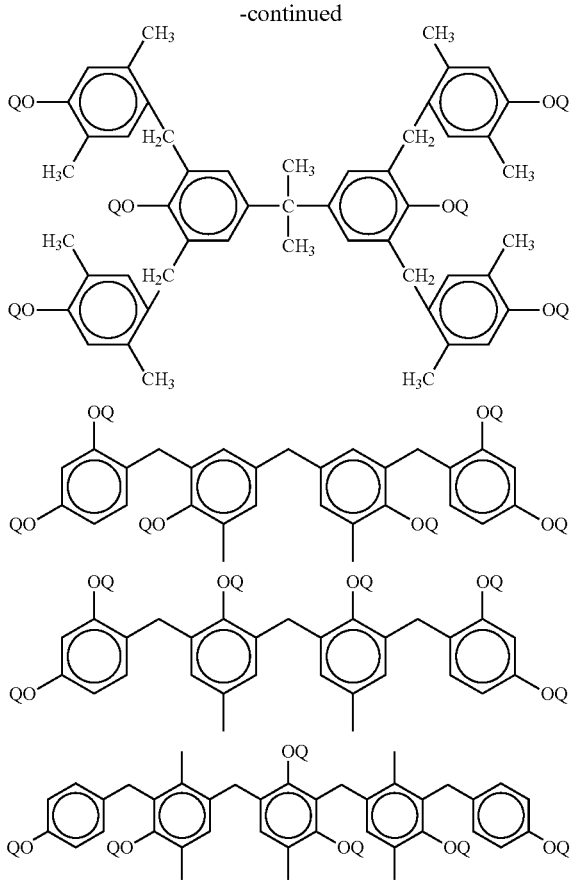

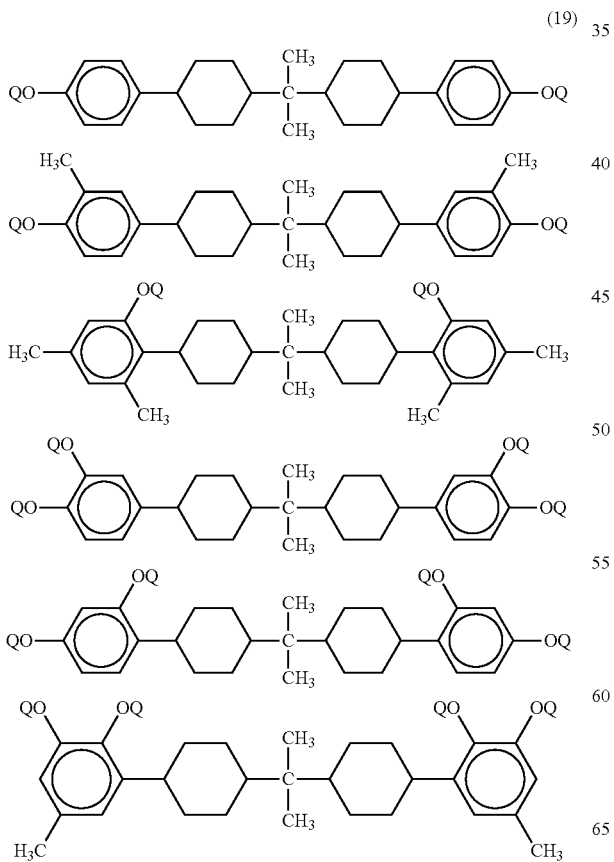

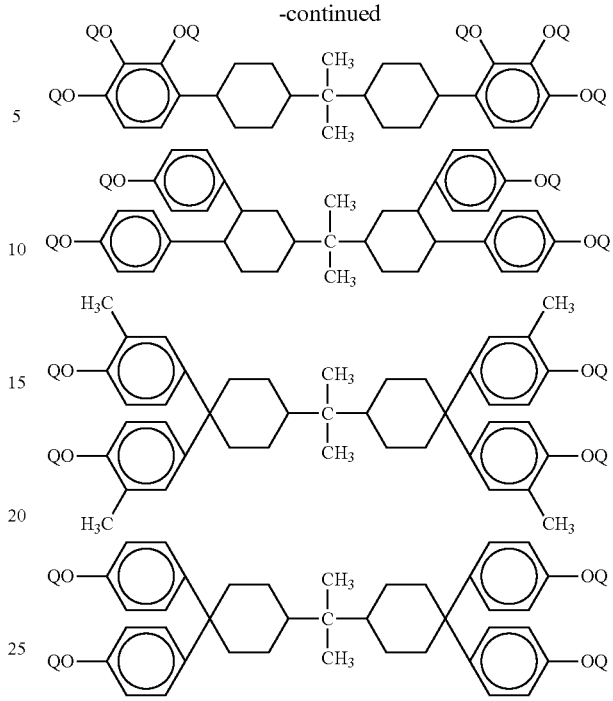

In the formulas (16) to (19), Q is selected from a hydrogen atom and groups (structures) shown by the following formulas (20) and (21). At least one Q of each compound is the structure shown by the formula (20) or (21).

The content of the photosensitizer (B) in the positive-type photosensitive resin composition is preferably 1 to 50 parts by weight, and particularly preferably 10 to 40 parts by weight, based on 100 parts by weight of the alkali-soluble resin (A). If the content of the photosensitizer (B) is within the above range, excellent sensitivity is obtained.

The silicon compound (C) is shown by the following general formula (1).

wherein $R_1$ represents an alkylene group having 5 to 30 carbon atoms or an organic group having at least one aromatic ring, and $R_2$ represents an alkyl group having 1 to 10 carbon atoms.

When the positive-type photosensitive resin composition includes the silicon compound (C) shown by the general formula (1), the resulting film exhibits improved adhesion to a substrate during development, and the resulting cured film exhibits improved adhesion to a substrate after humidification. Therefore, removal of a fine relief pattern does not occur during development, and removal of a pattern does not occur in an adhesion test in accordance with JIS D 0202 after humidification subsequent to a heat treatment (described later). It is conjectured that $R_1$ of the silicon compound (C) shown by the general formula (1) has high affinity to the alkali-soluble resin (A), and the alkoxysilane group interacts with the substrate, so that the above improvement in adhesion is achieved.

The positive-type photosensitive resin composition that includes the silicon compound (C) shown by the general formula (1) exhibits excellent storage stability when allowed to stand at room temperature. It is conjectured that the positive-type photosensitive resin composition exhibits excellent storage stability since the silicon compound (C) shown by the general formula (1) has a hydrophobic structure.

$R_1$ in the general formula (1) represents an alkylene group having 5 to 30 carbon atoms or an organic group that includes at least one aromatic ring.

Examples of the alkylene group having 5 to 30 carbon atoms represented by $R_1$ in the general formula (1) include a pentylene group, a hexylene group, a heptylene group, an octylene group, a nonylene group, a decylene group, an undecylene group, a dodecylene group, and the like. Among these, a hexylene group, a heptylene group, and an octylene group (number of carbon atoms: 6 to 8) are preferable. If the number of carbon atoms of the group represented by $R_1$ in the general formula (1) is less than the above range, elution into an alkaline solution may occur due to high affinity to the alkaline solution resulting from high hydrophilicity, so that adhesion during development may decrease. If the number of carbon atoms of the group represented by $R_1$ in the general formula (1) is more than the above range, affinity to the alkali-soluble resin (A) may decrease due to high hydrophobicity, so that adhesion during development and after curing may decrease.

Examples of the organic group that includes at least one aromatic ring represented by $R_1$ in the general formula (1) include, but are not limited to, structures shown by the following general formula (4).

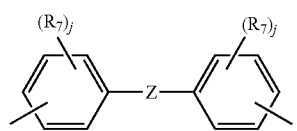

(4)

wherein $R_7$ individually represent an alkyl group, an alkoxy group, an acyloxy group, or a cycloalkyl group, j is an integer from 0 to 4, and Z represents a single bond, $-CH_2-$, $-CH(CH_3)-$, or $-C(CH_3)_2-$.

Among the structures shown by the general formula (4), one or more structures shown by the following formula (5) are preferable since the resulting film exhibits improved adhesion to a substrate during development, the resulting cured film exhibits improved adhesion to a substrate after humidification, and the composition exhibits excellent storage stability.

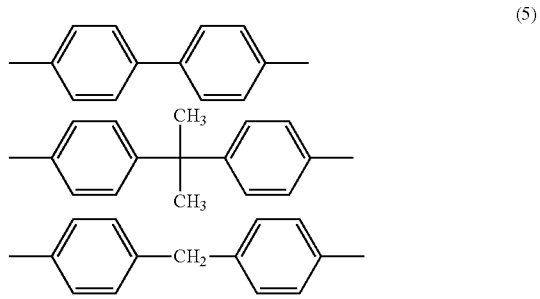

(5)

$R_2$ in the general formula (1) represents an alkyl group having 1 to 10 carbon atoms. Examples of the alkyl group having 1 to 10 carbon atoms represented by $R_2$ include, but are not limited to, a methyl group, an ethyl group, a propyl group, an isopropyl group, a butyl group, a sec-butyl group, a tert-butyl group, a pentyl group, a hexyl group, a heptyl group, an octyl group, a 2-ethylhexyl group, a nonyl group, a decyl group, and the like. Among these, a methyl group and an ethyl group are preferable due to excellent hydrolyzability.

The content of the silicon compound (C) shown by the general formula (1) is preferably 0.05 to 50 parts by weight, and particularly preferably 0.1 to 20 parts by weight, based on 100 parts by weight of the alkali-soluble resin (A). If the content of the silicon compound (C) shown by the general formula (1) is within the above rang, the resulting film exhibits improved adhesion to a substrate during development, the resulting cured film exhibits improved adhesion to a substrate after humidification, and the positive-type photosensitive resin composition exhibits improved storage stability.

The silicon compound (C) is not particularly limited. Examples of the silicon compound (C) shown by the general formula (1) in which $R_1$ represents an alkylene group having 5 to 30 carbon atoms include bis(trimethoxysilyl)hexane, bis(triethoxysilyl)hexane, bis(trimethoxysilyl)octane, bis(triethoxysilyl)octane, bis(trimethoxysilyl)decane, bis(triethoxysilyl)decane, and the like. Examples of the silicon compound (C) shown by the general formula (1) in which $R_1$ represents an organic group that includes at least one aromatic ring include bis(trimethoxysilyl)benzene, bis(triethoxysilyl)benzene, bis(triethoxysilyl)biphenyl, bis(trimethoxysilyl)biphenyl, methylenebis(trimethoxysilyl)benzene, methylenebis(triethoxysilyl)benzene, isopropylidenebis(trimethoxysilyl)benzene, isopropylidenebis(triethoxysilyl)benzene, and the like. Among these, bis(trimethoxysilyl)hexane, bis(triethoxysilyl)hexane, bis(trimethoxysilyl)biphenyl, and bis(triethoxysilyl)biphenyl are preferable since the resulting film exhibits improved adhesion to a substrate during development, the resulting cured film exhibits improved adhesion to a substrate after humidification, and the positive-type photosensitive resin composition exhibits improved storage stability. The positive-type photosensitive resin composition includes at least one (one type of) silicon compound (C) shown by the following general formula (1).

The positive-type photosensitive resin composition may further include (D) a phenolic hydroxyl group-containing compound in order to improve sensitivity, and suppress scum during patterning.

Specific examples of the phenolic hydroxyl group-containing compound (D) include compounds shown by the following formula (22). These compounds may be used either individually or in combination as the phenolic hydroxyl group-containing compound (D).

(22)

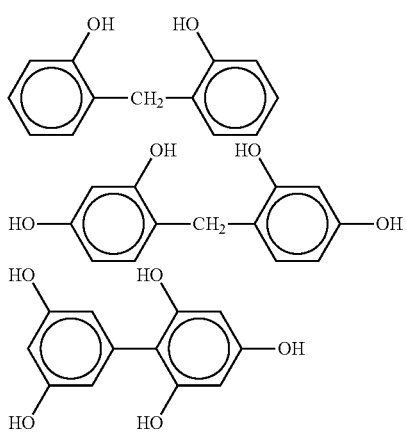

The content of the phenolic hydroxyl group-containing compound (D) is preferably 1 to 30 parts by weight, and particularly preferably 1 to 20 parts by weight, based on 100 parts by weight of the alkali-soluble resin (A). If the content of the phenolic hydroxyl group-containing compound (D) is within the above range, occurrence of scum during development is suppressed, and dissolution of the exposed area is promoted so that sensitivity is improved.

The positive-type photosensitive resin composition may further include additives such as a leveling agent (e.g., acrylic leveling agent, silicone-based leveling agent, fluorine-based leveling agent, or vinyl-based leveling agent), and a silane coupling agent other than the silicon compound (C) shown by the general formula (1).

Examples of the silane coupling agent include, but are not limited to, 3-glycidoxypropyltrimethoxysilane, 3-glycidoxypropylmethyldiethoxysilane, 3-glycidoxypropyltriethoxysilane, p-styryltrimethoxysilane, 3-methacryloxypropylmethyldimethoxysilane, 3-methacryloxypropyltrimethoxysilane, 3-methacryloxypropylmethyldiethoxysilane, 3-methacryloxypropyltriethoxysilane, 3-acryloxypropyltrimethoxysilane, N-2-(aminoethyl)-3-aminopropylmethyldimethoxysilane, N-2-(aminoethyl)-3-aminopropyltrimethoxysilane, N-2-(aminoethyl)-3-aminopropyltriethoxysilane, 3-aminopropyltrimethoxysilane, 3-aminopropyltriethoxysilane, N-phenyl-3-aminopropyltrimethoxysilane, 3-mercaptopropylmethyldimethoxysilane, 3-mercaptopropyltrimethoxysilane, bis(triethoxypropyl)tetrasulfide, 3-isocyanatepropyltriethoxysilane, a silicon coupling agent obtained by reacting a silicon compound including an amino group with an acid dianhydride or an acid anhydride, and the like.

Examples of the silicon compound including an amino group used to produce the silane coupling agent include, but are not limited to, 3-aminopropyltrimethoxysilane, N-(2-aminoethyl)-3-aminopropyltrimethoxysilane, 3-aminopropylmethyldimethoxysilane, N-(2-aminoethyl)-3-aminopropyltriethoxysilane, 3-aminopropyltriethoxysilane, and the like.

Examples of the acid anhydride used to produce the silane coupling agent include, but are not limited to, maleic anhydride, chloromaleic anhydride, cyanomaleic anhydride, citraconic anhydride, phthalic anhydride, and the like. These acid anhydrides may be used either individually or in combination.

Examples of the dianhydride used to produce the silane coupling agent include, but are not limited to, pyromellitic dianhydride, benzene-1,2,3,4-tetracarboxylic dianhydride, 3,3',4,4'-benzophenonetetracarboxylic dianhydride, 2,3,3',4'-benzophenonetetracarboxylic dianhydride, naphthalene-2,3,6,7-tetracarboxylic dianhydride, naphthalene-1,2,5,6-tetracarboxylic dianhydride, naphthalene-1,2,4,5-tetracarboxylic dianhydride, naphthalene-1,4,5,8-tetracarboxylic dianhydride, naphthalene-1,2,6,7-tetracarboxylic dianhydride, 4,8-dimethyl-1,2,3,5,6,7-hexahydronaphthalene-1,2,5,6-tetracarboxylic dianhydride, 4,8-dimethyl-1,2,3,5,6,7-hexahydronaphthalene-2,3,6,7-tetracarboxylic dianhydride, 2,6-dichloronaphthalene-1,4,5,8-tetracarboxylic dianhydride, 2,7-dichloronaphthalene-1,4,5,8-tetracarboxylic dianhydride, 2,3,6,7-tetrachloronaphthalene-1,4,5,8-tetracarboxylic dianhydride, 1,4,5,8-tetra-chloronaphthalene-2,3,6,7-tetracarboxylic dianhydride, 3,3',4,4'-diphenyltetracarboxylic dianhydride, 2,2',3,3'-diphenyltetracarboxylic dianhydride, 2,3,3',4'-diphenyltetracarboxylic dianhydride, 3,3',4,4'-p-terphenyltetracarboxylic dianhydride, 2,2',3,3'-p-terphenyltetracarboxylic dianhydride, 2,3,3',4'-p-terphenyltetracarboxylic dianhydride, 2,2-bis(2,3-dicarboxyphenyl)-propanedianhydride, 2,2-bis(3,4-dicarboxyphenyl)-propanedianhydride, bis(2,3-dicarboxyphenyl)ether dianhydride, bis(3,4-dicarboxyphenyl)ether dianhydride, bis(2,3-dicarboxyphenyl)methane dianhydride, bis(3,4-dicarboxyphenyl)methane dianhydride, bis(2,3-dicarboxyphenyl)sulfone dianhydride, bis(3,4-dicarboxyphenyl)sulfone dianhydride, 1,1-bis(2,3-dicarboxyphenyl)ethane dianhydride, 1,1-bis(3,4-dicarboxyphenyl)ethane dianhydride, perylene-2,3,8,9-tetracarboxylic dianhydride, perylene-3,4,9,10-tetracarboxylic dianhydride, perylene-4,5,10,11-tetracarboxylic dianhydride, perylene-5,6,11,12-tetracarboxylic dianhydride, phenanthrene-1,2,7,8-tetracarboxylic dianhydride, phenanthrene-1,2,6,7-tetracarboxylic dianhydride, phenanthrene-1,2,9,10-tetracarboxylic dianhydride, pyrazine-2,3,5,6-tetracarboxylic dianhydride, pyrrolidine-2,3,4,5-tetracarboxylic dianhydride, thiophene-2,3,4,5-tetracarboxylic dianhydride, 4,4'-hexafluoroisopropylidenediphthalic dianhydride, and the like. These acid dianhydrides may be used either individually or in combination.

In the case of the silane coupling agent is obtained by reacting the silicon compound including an amino group with the acid dianhydride or the acid anhydride, as the combination of the silicon compound including an amino group and the acid dianhydride or the acid anhydride, it is preferable to use a combination of bis(3,4-dicarboxyphenyl)ether dianhydride and 3-aminopropyltriethoxysilane, a combination of 3,3',4,4'-benzophenonetetracarboxylic dianhydride and 3-aminopropyltriethoxysilane, a combination of bis(3,4-dicarboxyphenyl)sulfone dianhydride and 3-aminopropyltriethoxysilane, or a combination of maleic anhydride and 3-aminopropyltriethoxysilane since the resulting positive-type photosensitive resin composition exhibits improved storage stability, the resulting film exhibits improved adhesion to a substrate during development, and the resulting cured film exhibits improved adhesion to a substrate (e.g., silicon wafer) after humidification.

The positive-type photosensitive resin composition is produced by dissolving the above components in a solvent, and used in the form of a varnish. Examples of the solvent include N-methyl-2-pyrrolidone, γ-butyrolactone, N,N-dimethylacetamide, dimethyl sulfoxide, diethylene glycol dimethyl ether, diethylene glycol diethyl ether, diethylene glycol dibutyl ether, propylene glycol monomethyl ether, dipropylene glycol monomethyl ether, propylene glycol monomethyl ether acetate, methyl lactate, ethyl lactate, butyl lactate, methyl-1,3-butylene glycol acetate, 1,3-butylene glycol 3-monomethyl ether, methyl pyruvate, ethyl pyruvate, methyl-3-methoxypropionate, and the like. These solvents may be used either individually or in combination.

The positive-type photosensitive resin composition is used as follows. Specifically, the positive-type photosensitive resin composition is applied to an appropriate support (substrate) (e.g., silicon wafer, ceramic substrate, or aluminum substrate). When applying the positive-type photosensitive resin composition to a semiconductor element, the positive-type photosensitive resin composition is applied so that the cured film has a thickness of 0.1 to 30 µm. If the thickness of the cured film is less than 0.1 µm, the cured film may not sufficiently function as a surface protective film for the semiconductor element. If the thickness of the cured film is more than 30 µm, it may be difficult to obtain a fine pattern. Moreover, processing may take time, so that the throughput may decrease. The positive-type photosensitive resin composition may be applied by spin coating using a spinner, spray coating using a spray coater, dipping, printing, roll coating, or the like. The resulting film is prebaked (dried) at 60 to 130° C., and irradiated with actinic rays along a desired pattern shape. Examples of the actinic rays include X-rays, electron beams, UV rays, visible rays, and the like. It is preferable to use actinic rays having a wavelength of 200 to 500 nm.

The irradiated area is dissolved and removed using a developer to obtain a relief pattern. Examples of the developer include an aqueous solution of alkali such as inorganic alkali (e.g., sodium hydroxide, potassium hydroxide, sodium carbonate, sodium silicate, sodium metasilicate, or aqueous ammonia), a primary amine (e.g., ethylamine or n-propylamine), a secondary amine (e.g., diethylamine or di-n-propylamine), a tertiary amine (e.g., triethylamine or methyldiethylamine) an alcohol amine (e.g., dimethylethanolamine or triethanolamine), or a quaternary ammonium salt (e.g., tetramethylammonium hydroxide or tetraethylammonium hydroxide), and above-mentioned aqueous solutions obtained by adding an appropriate amount of a water-soluble organic solvent such as an alcohol (e.g., methanol or ethanol) or a surfactant to the above aqueous solution. As the developing method, a spray developing method, a puddle developing method, an immersion developing method, an ultrasonic developing method, or the like may be used.

The relief pattern formed by development is then rinsed. Distilled water is used as the rinse agent. The film is then heated (cured) so that the alkali-soluble resin (A) included in the resin composition forms an oxazole ring, an imide ring or an oxazole ring and an imide ring to obtain the desired pattern (cured film) that exhibits excellent heat resistance.

The film is preferably heated at 180 to 380° C., and more preferably 200 to 350° C.

A cured film according to one embodiment of the present invention (i.e., a cured film that includes a cured product of the above positive-type photosensitive resin composition) is described below. The cured film (cured product of the positive-tone photosensitive resin composition) is useful for semiconductor device (e.g., semiconductor element) applications and display device (e.g., TFT liquid crystal display device and organic EL display device) applications, and is also useful as an interlayer dielectric for a multilayered circuit, a cover coating for a flexible copper-clad sheet, a solder resist film, and a liquid crystal alignment film. Examples of semiconductor device applications include a passivation film obtained by forming a cured film of the positive-type photosensitive resin composition on a semiconductor element, a protective film (e.g., buffer coat film) obtained by forming a cured film of the positive-type photosensitive resin composition on a passivation film, an insulating film (e.g., interlayer dielectric) obtained by forming a cured film of the positive-type photosensitive resin composition on a circuit formed on a semiconductor element, an α-ray shielding film, a planarization film, a projection (resin post), a barrier rib, and the like. Examples of display device applications include a protective film obtained by forming a cured film of the positive-type photosensitive resin composition on a display element, an insulating film or a planarization film for a TFT element or a color filter, a projection for an MVA liquid crystal display or the like, a cathode separator (partition) for an organic EL element, and the like. In this case, a patterned layer of the positive-type photosensitive resin composition is formed by the above method on a substrate on which a display element or a color filter is formed. An insulating film or a planarization film used in the display device applications is required to exhibit high transparency. A resin layer that exhibits excellent transparency can be obtained by performing a post-exposure step before curing a layer of the positive-type photosensitive resin composition.

EXAMPLES

The present invention is further described below by way of examples.

Example 1

Synthesis of Alkali-Soluble Resin (A-1)

A four-necked separable flask equipped with a thermometer, a stirrer, a raw material inlet, and a dry nitrogen gas supply pipe was charged with 443.21 g (0.900 mol) of a dicarboxylic acid derivative (active ester) obtained by reacting 0.900 mol of diphenyl ether-4,4'-dicarboxylic acid with 1.800 mol of 1-hydroxy-1,2,3-benzotriazole, 329.63 g (0.900 mol) of hexafluoro-2,2-bis(3-amino-4-hydroxyphenyl)propane, and 23.22 g (0.100 mol) of 3,3-diamino-4,4-dihydroxydiphenyl ether. 3200 g of N-methyl-2-pyrrolidone was added to the mixture to obtain a solution. The components were reacted at 75° C. for 12 hours using an oil bath.

After the addition of 34.43 g (0.200 mol) of 4-ethynylphthalic anhydride dissolved in 100 g of N-methyl-2-pyrrolidone, the mixture was stirred for 12 hours to complete the reaction. The reaction mixture was filtered, and poured into a 3:1 (volume ratio) mixture of water and isopropanol. The resulting precipitate was collected by filtration, sufficiently washed with water, and dried under vacuum to obtain the target alkali-soluble resin (A-1).

Synthesis of Photosensitizer

A four-necked separable flask equipped with a thermometer, a stirrer, a raw material inlet, and a dry nitrogen gas supply pipe was charged with 15.82 g (0.025 mol) of a phenol compound shown by the following formula (Q-1) and 8.40 g (0.083 mol) of triethylamine. 135 g of tetrahydrofuran was added to the mixture to obtain a reaction solution. After cooling the reaction solution to 10° C. or less, 22.30 g (0.083 mol) of 1,2-naphthoquinone-2-diazido-4-sulfonyl chloride in 100 g of tetrahydrofuran were slowly added dropwise to the reaction solution while maintaining the temperature of the reaction solution at less than 10° C. After stirring the mixture at 10° C. or less for 5 minutes, the mixture was stirred at room temperature for 5 hours to complete the reaction. The reaction mixture was filtered, and poured into a 3:1 (volume ratio) mixture of water and methanol. The resulting precipitate was collected by filtration, sufficiently washed with water, and dried under vacuum to obtain a photosensitizer shown by the following formula (B-1).

Production of Positive-Type Photosensitive Resin Composition 100 g of the alkali-soluble resin (A-1), 15 g of the photosensitizer shown by the formula (B-1), and 10 g of a silicon compound shown by the following formula (C-1) were dissolved in 150 g of γ-butyrolactone. The solution was filtered through a Teflon (registered trademark) filter (pore size: 0.2 μm) to obtain a positive-type photosensitive resin composition.

Evaluation of Adhesion during Development

The positive-type photosensitive resin composition was applied to a silicon wafer using a spin coater, and prebaked on a hot plate at 120° C. for 4 minutes to obtain a film having a thickness of about 11.0 μm. The film was exposed using an i-line stepper ("4425i" manufactured by Nikon Corporation) through a mask (manufactured by Toppan Printing Co., Ltd., Test Chart No. 1: a line pattern and a space pattern having a width of 0.88 to 50 μm were drawn) while changing the dose from 200 to 1560 mJ/cm$^2$ by 20 mJ/cm$^2$.

The film was developed using a 2.38% tetramethylammonium hydroxide aqueous solution for a time sufficient to reduce the thickness of the unexposed area by 1.5 to 2.5 μm. The exposed area was thus dissolved and removed. The film was then rinsed with purified water for 10 seconds. After development, the presence or absence of removal of an area (3 μm line) with a mask open size of 3 μm was determined in an area in which the dose was higher than the pattern-forming dose by 100 to 300 mJ/cm$^2$. A dose at which the open width was 10 μm in an area (10 μm line) with a mask open size of 10 μm is referred to as $E_{op}$, and a dose at which removal of the pattern occurred in an area (3 μm line) with a mask open size of 3 μm is referred to as $E_x$. A large difference between the dose $E_x$ and the dose $E_{op}$ indicates that the pattern area exhibited high adhesion during development.

It was confirmed that the area (3 μm line) with a mask open size of 3 μm was not removed even if the dose was increased (i.e., the unexposed area was not removed from the substrate during development). Note that adhesion during development was evaluated under severe conditions where the initial thickness of the film was larger than a normal thickness, and the thickness of the film was decreased by a larger amount.

Evaluation of Adhesion after Humidification

The positive-type photosensitive resin composition was applied to a silicon wafer using a spin coater, and prebaked on a hot plate at 120° C. for 4 minutes to obtain a film having a thickness of about 8.0 μm.

The film was heated (cured) in a clean oven at 150° C. for 30 minutes and at 320° C. for 30 minutes at an oxygen concentration of 1000 ppm or less to obtain a cured film. The cured film was cut in accordance with JIS K 5400 using an utility knife to obtain a sample having one hundred 1×1 mm squares (10 rows and 10 columns). The sample was subjected to a humidification (pressure cooker) test for 24 hours at a temperature of 125° C. and a humidity of 100% under a pressure of 0.2 MPa, and evaluated in accordance with JIS D 0202. The number of squares removed from the sample was zero. A problem occurs in practice even if only one square is removed. It was thus confirmed that the sample exhibited excellent adhesion after humidification.

Evaluation of Storage Stability

The viscosity (T1) of the positive-type photosensitive resin composition was measured using an E-type viscometer ("TV-22" manufactured by Toki Sangyo Co., Ltd.). The viscosity (T1) of the positive-type photosensitive resin composition thus measured was 988 mPa·s. The positive-type photosensitive resin composition was then allowed to stand at room temperature for 20 days, and the viscosity (T2) of the positive-type photosensitive resin composition was again measured, and found to be 1078 mPa·s. The viscosity increase rate calculated by "[(T2)−(T1)]/(T1))×100(%)" was 9%. No problem occurs if the viscosity increase rate over 10 days is 10% or less. It was thus confirmed that the positive-type photosensitive resin composition exhibited excellent storage stability at room temperature.

Example 2

A positive-type photosensitive resin composition was produced and evaluated in the same manner as in Example 1, except that 10 g of a silicon compound shown by the following formula (C-2) was used instead of 10 g of the silicon compound shown by the formula (C-1).

Example 3

An alkali-soluble resin (A-2) was synthesized in the same manner as in Example 1, except that 0.45 mol of diphenyl ether-4,4'-dicarboxylic acid and 0.45 mol of isophthalic acid were used instead of 0.900 mol of diphenyl ether-4,4'-dicarboxylic acid, and 286.4 g (1.000 mol) of 4,4'-methylenebis(2-amino-3,6-dimethylphenol) was used instead of 329.63 g (0.900 mol) of hexafluoro-2,2-bis(3-amino-4-hydroxyphenyl)propane and 23.22 g (0.100 mol) of 3,3-diamino-4,4-dihydroxydiphenyl ether.

A positive-tone photosensitive resin composition was produced and evaluated in the same manner as in Example 1, except for using the alkali-soluble resin (A-2) instead of the alkali-soluble resin (A-1).

Example 4

A positive-tone photosensitive resin composition was produced and evaluated in the same manner as in Example 2, except for using the alkali-soluble resin (A-2) instead of the alkali-soluble resin (A-1).

Example 5

An alkali-soluble resin (A-3) was synthesized in the same manner as in Example 1, except for using 0.54 mol of the dicarboxylic acid derivative (active ester) and 0.36 mol of 4,4'-oxydiphthalic anhydride instead of 0.900 mol of the dicarboxylic acid derivative (active ester).

A positive-tone photosensitive resin composition was produced and evaluated in the same manner as in Example 1, except for using the alkali-soluble resin (A-3) instead of the alkali-soluble resin (A-1).

Example 6

A positive-tone photosensitive resin composition was produced and evaluated in the same manner as in Example 2, except for using the alkali-soluble resin (A-3) instead of the alkali-soluble resin (A-1).

Comparative Example 1

A positive-type photosensitive resin composition was produced and evaluated in the same manner as in Example 3, except that the silicon compound shown by the formula (C-1) was not used.

Comparative Example 2

A positive-type photosensitive resin composition was produced and evaluated in the same manner as in Example 1, except that 10 g of a silicon compound shown by the following formula (C-3) was used instead of 10 g of the silicon compound shown by the formula (C-1).

Example 7

A positive-type photosensitive resin composition was produced and evaluated in the same manner as in Example 4, except that 5 g of the silicon compound shown by the formula (C-2) was used instead of 10 g of the silicon compound shown by the formula (C-2).

Example 8

A positive-type photosensitive resin composition was produced and evaluated in the same manner as in Example 3, except that 10 g of a silicon compound shown by the following formula (C-4) was used instead of 10 g of the silicon compound shown by the formula (C-1).

Example 9

A positive-type photosensitive resin composition was produced and evaluated in the same manner as in Example 8, except that 5 g of the silicon compound shown by the formula (C-4) was used instead of 10 g of the silicon compound shown by the formula (C-4).

Example 10

A positive-type photosensitive resin composition was produced and evaluated in the same manner as in Example 3, except that 10 g of a silicon compound shown by the following formula (C-5) was used instead of 10 g of the silicon compound shown by the formula (C-1).

Example 11

A positive-type photosensitive resin composition was produced and evaluated in the same manner as in Example 3, except that 10 g of a silicon compound shown by the following formula (C-6) was used instead of 10 g of the silicon compound shown by the formula (C-1).

Comparative Example 3

A positive-type photosensitive resin composition was produced and evaluated in the same manner as in Example 3, except that 10 g of a silicon compound shown by the following formula (C-7) was used instead of 10 g of the silicon compound shown by the formula (C-1).

Comparative Example 4

A positive-type photosensitive resin composition was produced and evaluated in the same manner as in Example 3, except that 10 g of a silicon compound shown by the following formula (C-8) was used instead of 10 g of the silicon compound shown by the formula (C-1).

The structure of the compounds (Q-1), (B-1), (C-1), (C-2), (C-3), (C-4), (C-5), (C-6), (C-7), and (C-8) used in the examples and the comparative examples are given below. In Tables 1 and 2, the unit of the amounts of the alkali-soluble resin and the silicon compound is parts by weight.

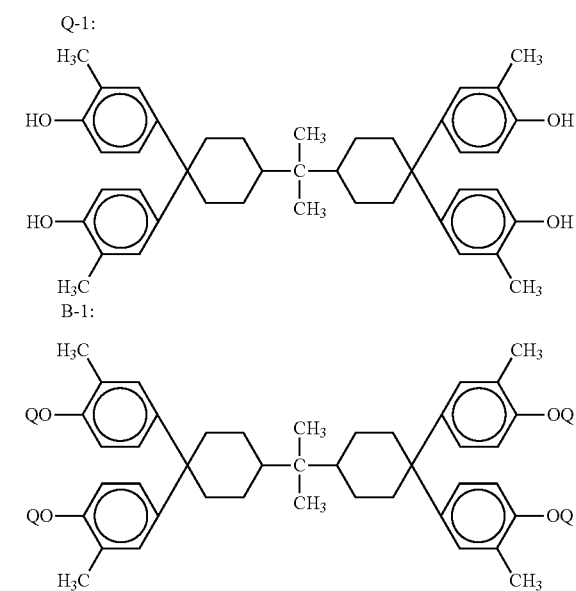

(Q represents a hydrogen atom or

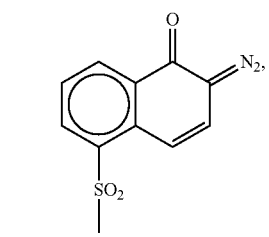

and 83% of Q represents

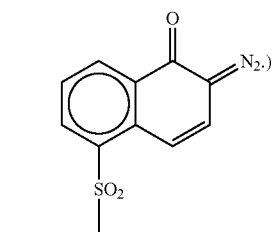

(C-1):

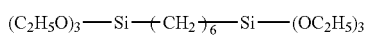

(C-2):

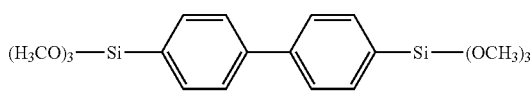

-continued (C-3):

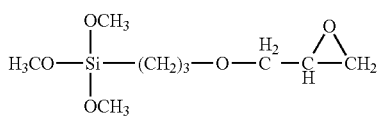

(C-4):
(C-5):

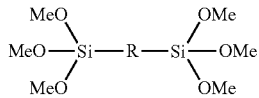

C4: R = (CH$_2$)$_6$
C5: R = (CH$_2$)$_8$ (C-6):

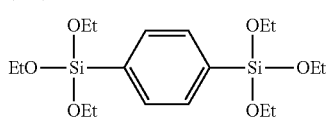

(C-7):

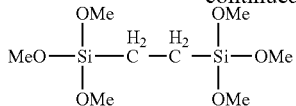

(C-8):

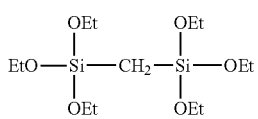

As shown in Tables 1 and 2, the film was not removed (i.e., exhibited excellent adhesion to the substrate) in Examples 1 to 10 during development step and after humidification. In Examples 1 to 10, the viscosity increase rate at room temperature over 10 days was 10% or less (i.e., excellent storage stability was achieved).

In Example 11, removal of the film did not occur during development at the dose $E_{op}$. However, removal of the film occurred at a dose of 150 mJ/cm$^2$ (see Table 2). In Example 11, the cured film was not removed (i.e., exhibited excellent adhesion to the substrate) after humidification. In Example 11, the viscosity increase rate at room temperature over 10 days was 10% or less (i.e., excellent storage stability was achieved).

TABLE 1

| | | Example 1 | Example 2 | Example 3 | Example 4 | Example 5 | Example 6 | Comparative Example 1 | Comparative Example 2 |
|---|---|---|---|---|---|---|---|---|---|
| Alkali-soluble resin (A) | | A-1 | A-1 | A-2 | A-2 | A-3 | A-3 | A-2 | A-2 |
| | | 100 | 100 | 100 | 100 | 100 | 100 | 100 | 100 |
| Photosensitizer (B) | Formula (B-1) | 15 | 15 | 15 | 15 | 15 | 15 | 15 | 15 |
| Silicon compound (C) | Formula (C-1) | 10 | | 10 | | 10 | | | |
| | Formula (C-2) | | 10 | | 10 | | 10 | | |
| | Formula (C-3) | | | | | | | | 10 |
| Evaluation of adhesion during development | Removal of line | None | None | None | None | None | None | Removed | Removed |
| | $E_{op}$ (mJ/cm$^2$) | 540 | 580 | 620 | 650 | 600 | 630 | 600 | 640 |
| | $E_x$ (mJ/cm$^2$) | >1560 | >1560 | >1560 | >1560 | >1560 | >1560 | 530 | 540 |
| | $E_x - E_{op}$ (mJ/cm$^2$) | >1020 | >980 | >940 | >910 | >960 | >930 | −70 | −100 |
| Evaluation of adhesion after humidification | | 0/100 | 0/100 | 0/100 | 0/100 | 0/100 | 0/100 | 89/100 | 33/100 |
| Evaluation of storage stability | | 9% | 7% | 10% | 9% | 9% | 9% | 3% | 23% |

TABLE 2

| | | Example 7 | Example 8 | Example 9 | Example 10 | Example 11 | Comparative Example 3 | Comparative Example 4 |
|---|---|---|---|---|---|---|---|---|
| Alkali-soluble resin (A) | | A-2 | A-2 | A-2 | A-2 | A-2 | A-2 | A-2 |
| | | 100 | 100 | 100 | 100 | 100 | 100 | 100 |
| Photosensitizer (B) | Formula (B-1) | 15 | 15 | 15 | 15 | 15 | 15 | 15 |
| Silicon compound (C) | Formula (C-2) | 5 | | | | 10 | | |
| | Formula (C-4) | | 10 | 5 | | | | |
| | Formula (C-5) | | | | 10 | | | |
| | Formula (C-6) | | | | | 10 | | |
| | Formula (C-7) | | | | | | 10 | |
| | Formula (C-8) | | | | | | | 10 |
| Evaluation of adhesion during development | Removal of line | None | None | None | None | None | Removed | Removed |
| | $E_{op}$ (mJ/cm$^2$) | 610 | 610 | 600 | 630 | 670 | 610 | 600 |
| | $E_x$ (mJ/cm$^2$) | >1560 | >1560 | >1560 | >1560 | 820 | 520 | 520 |
| | $E_x - E_{op}$ (mJ/cm$^2$) | >950 | >950 | >960 | >930 | 150 | −90 | −80 |
| Evaluation of adhesion after humidification | | 0/100 | 0/100 | 0/100 | 0/100 | 0/100 | 19/100 | 30/100 |
| Evaluation of storage stability | | 3% | 6% | 3% | 9% | 10% | 8% | 7% |

The line is easily removed at a high dose. This is because the opening becomes large at a high dose, so that the width of the line decreases (i.e., removal easily occurs).

INDUSTRIAL APPLICABILITY

The positive-type photosensitive resin composition according to the present invention exhibits excellent storage stability, produces a film that exhibits excellent adhesion to a substrate during development, produces a cured film that exhibits excellent adhesion to a substrate after humidification, and may be suitably used to produce a surface protective film, an interlayer dielectric, and the like for a semiconductor element and a display element.

The invention claimed is:

1. A positive-type photosensitive resin composition comprising (A) an alkali-soluble resin, (B) a photosensitizer, and (C) a silicon compound shown by the following general formula (1),

(1)

wherein —$R_1$— in the general formula (1) represents a structure shown by the following general formula (4),

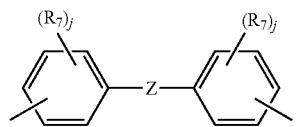
(4)

wherein $R_7$ individually represent an alkyl group, an alkoxy group, an acyloxy group, or a cycloalkyl group ($R_7$ may be the same or different), j is an integer from 0 to 4, and Z represents a single bond, —$CH_2$—, —CH($CH_3$)—, or —C($CH_3$)$_2$—, and $R_2$ represents an alkyl group having 1 to 10 carbon atoms.

2. The positive-type photosensitive resin composition according to claim 1, wherein the alkali-soluble resin (A) includes a polyamide resin that includes a repeating unit shown by the following general formula (2),

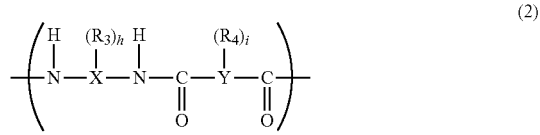
(2)

wherein X and Y represent an organic group, $R_3$ individually represents hydroxyl group, —O—$R_5$, an alkyl group, an acyloxy group, or a cycloalkyl group ($R_3$ may be the same or different), $R_4$ individually represents a hydroxyl group, a carboxyl group, —O—$R_5$, or —COO—$R_5$ ($R_4$ may be the same or different), h is an integer from 0 to 8, i is an integer from 0 to 8, and $R_5$ represents an organic group having 1 to 15 carbon atoms, provided that $R_3$ may be the same or different when h is an integer equal to or larger than 2, at least one $R_4$ represents a carboxyl group when $R_3$ does not represent a hydroxyl group, and at least one $R_3$ represents a hydroxyl group when $R_4$ does not represent a carboxyl group.

3. The positive-type photosensitive resin composition according to claim 2, wherein X in the general formula (2) is at least one of structures shown by the following formula (3),

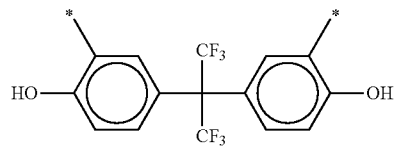
(3-1)

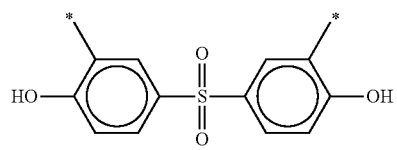
(3-2)

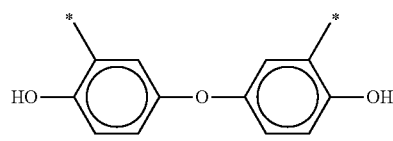
(3-3)

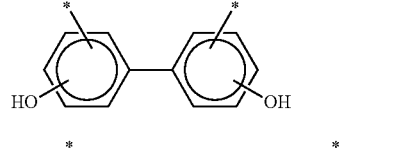
(3-4)

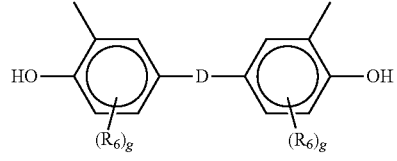
(3-5)

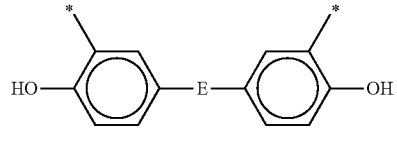
(3-6)

wherein the asterisk (*) represents the NH group, D represents —$CH_2$—, —CH($CH_3$)—, —C($CH_3$)$_2$—, —O—, —S—, —$SO_2$—, —CO—, —NHCO—, —C($CF_3$)$_2$—, or a single bond, E represents —$CH_2$—, —CH($CH_3$)—, or —C($CH_3$)$_2$—, $R_6$ individually represent an alkyl group, an alkoxy group, an acyloxy group, or a cycloalkyl group ($R_6$ may be the same or different), and g is an integer from 1 to 3.

4. The positive-type photosensitive resin composition comprising according to claim 1, wherein —$R_1$— in the general formula (1) represents at least one of structures shown by the following general formula (5),

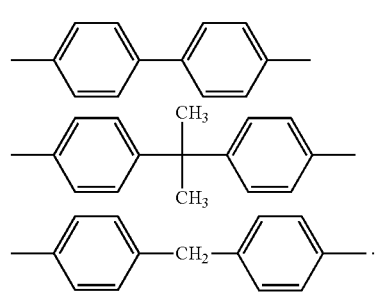
(5)

5. The positive-type photosensitive resin composition according to claim 1, wherein the content of the silicon compound (C) is 0.05 to 50 parts by weight based on 100 parts by weight of the alkali-soluble resin (A).

6. A cured film comprising a cured product of the positive-tone photosensitive resin composition according to claim 1.

7. A protective film comprising the cured film according to claim 6.

8. An insulating film comprising the cured film according to claim 6.

9. A semiconductor device comprising the cured film according to claim 6.

10. A display device comprising the cured film according to claim 6.

* * * * *